(12) United States Patent
Daimon et al.

(10) Patent No.: US 12,355,425 B2
(45) Date of Patent: Jul. 8, 2025

(54) ACOUSTIC WAVE DEVICE

(71) Applicant: Murata Manufacturing Co., Ltd., Nagaokakyo (JP)

(72) Inventors: Katsuya Daimon, Nagaokakyo (JP); Kazuhiro Takigawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 807 days.

(21) Appl. No.: 17/679,394

(22) Filed: Feb. 24, 2022

(65) Prior Publication Data

US 2022/0182037 A1 Jun. 9, 2022

Related U.S. Application Data (63) Continuation of application No. PCT/JP2020/031658, filed on Aug. 21, 2020.

(30) Foreign Application Priority Data

Aug. 30, 2019 (JP) ................. 2019-158337

(51) Int. Cl.
*H03H 9/02* (2006.01)
*H03H 9/13* (2006.01)
*H03H 9/17* (2006.01)

(52) U.S. Cl.
CPC .......... *H03H 9/17* (2013.01); *H03H 9/02992* (2013.01); *H03H 9/13* (2013.01)

(58) Field of Classification Search
CPC ........ H03H 9/13; H03H 9/17; H03H 9/02535; H03H 9/02685; H03H 9/02992

USPC ...... 310/313 R, 313 A, 313 B, 313 C, 313 D
See application file for complete search history.

(56) References Cited

U.S. PATENT DOCUMENTS

| | | |
|---|---|---|
| 2013/0051588 A1 | 2/2013 | Ruile et al. |
| 2016/0126928 A1* | 5/2016 | Ruile ....................... H03H 9/25 310/313 B |
| 2017/0047905 A1 | 2/2017 | Araki et al. |
| 2018/0097508 A1 | 4/2018 | Iwamoto et al. |
| 2019/0131954 A1 | 5/2019 | Okada |
| 2020/0067489 A1 | 2/2020 | Takata |

FOREIGN PATENT DOCUMENTS

| | | |
|---|---|---|
| JP | 5503020 B2 | 5/2014 |
| WO | 2015/182522 A1 | 12/2015 |
| WO | 2016/208446 A1 | 12/2016 |
| WO | 2018/003338 A1 | 1/2018 |
| WO | 2018/225650 A1 | 12/2018 |

OTHER PUBLICATIONS

Official Communication issued in International Patent Application No. PCT/JP2020/031658, mailed on Oct. 6, 2020.

\* cited by examiner

*Primary Examiner* — Derek J Rosenau
(74) *Attorney, Agent, or Firm* — Keating & Bennett, LLP (57) ABSTRACT

An acoustic wave device includes an acoustic wave resonator and a longitudinally coupled acoustic wave resonator filter, in which the longitudinally coupled acoustic wave resonator filter is shorter than the acoustic wave resonator in terms of a length of first and second edge regions that is a dimension along an extending direction of electrode fingers of the first and second edge regions in an IDT electrode.

19 Claims, 7 Drawing Sheets

ACOUSTIC WAVE DEVICE

CROSS REFERENCE TO RELATED APPLICATIONS

This application claims the benefit of priority to Japanese Patent Application No. 2019-158337 filed on Aug. 30, 2019 and is a Continuation Application of PCT Application No. PCT/JP2020/031658 filed on Aug. 21, 2020. The entire contents of each application are hereby incorporated herein by reference.

BACKGROUND OF THE INVENTION

1. Field of the Invention

The present invention relates to an acoustic wave device including first and second edge regions that are low acoustic velocity regions provided at respective end portions in an intersecting region.

2. Description of the Related Art

In an acoustic wave device described in Japanese Patent No. 5503020, a piston mode is produced to suppress transverse mode ripples. More specifically, in an IDT electrode, a region in which adjacent electrode fingers are overlapped with each other in the acoustic wave propagation direction is regarded as an intersecting region. The intersecting region includes a central region and first and second edge regions arranged in the outer side portions in the electrode finger extending direction of the central region. The acoustic velocity in the first and second edge regions is lower than the acoustic velocity in the central region. Further, in the outer side portions of the first and second edge regions, regions in which the acoustic velocity is higher than that in the central region are provided. With this, a piston mode is produced.

In the acoustic wave device described in Japanese Patent No. 5503020, a piston mode is produced to suppress transverse mode ripples.

However, in an acoustic wave device including an acoustic wave resonator and a longitudinally coupled acoustic wave resonator filter, when first and second edge regions are provided, a transverse mode cannot be sufficiently suppressed in both of the acoustic wave resonator and the longitudinally coupled acoustic wave resonator filter in some cases.

SUMMARY OF THE INVENTION

Preferred embodiments of the present invention provide acoustic wave devices that each include an acoustic wave resonator and a longitudinally coupled acoustic wave resonator filter and that are each able to more effectively reduce or prevent a transverse mode.

An acoustic wave device according to a preferred embodiment of the present invention includes an acoustic wave resonator on a first piezoelectric substrate and including an IDT electrode, and a longitudinally coupled acoustic wave resonator filter on a second piezoelectric substrate and including a plurality of IDT electrodes. The IDT electrode of the acoustic wave resonator and the IDT electrodes of the longitudinally coupled acoustic wave resonator filter each include a plurality of electrode fingers. The electrode fingers include an intersecting region in which the electrode fingers are overlapped with each other in an acoustic wave propagation direction. The intersecting region includes a central region and first and second edge regions on respective outer side portions in an extending direction of the electrode fingers of the central region and have a lower acoustic velocity than the central region. First and second gap regions are on outer side portions in the extending direction of the electrode fingers of the first and second edge regions and have a higher acoustic velocity than the central region. When a dimension along the extending direction of the electrode fingers of the first and second edge regions is a length of the first and second edge regions, the length of the first and second edge regions in the longitudinally coupled acoustic wave resonator filter is shorter than the length of the first and second edge regions in the acoustic wave resonator.

With acoustic wave devices according to preferred embodiments of the present invention, a transverse mode is able to be effectively reduced or prevented in the acoustic wave resonator and the longitudinally coupled acoustic wave resonator filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings to clarify the present invention.

Each preferred embodiment described herein is exemplary and components and features of different preferred embodiments can be partially replaced or combined.

Figure 1:
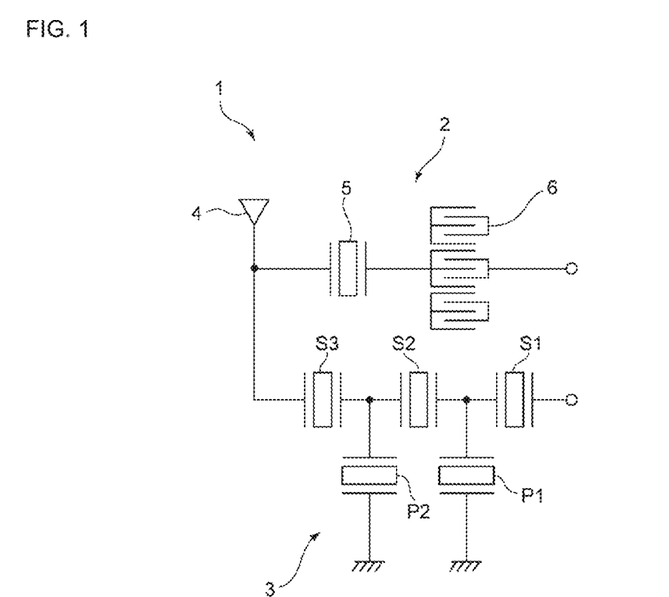
FIG. 1 is a circuit diagram of an acoustic wave device according to a first preferred embodiment of the present invention.

FIG. 1 is a circuit diagram of an acoustic wave device according to a first preferred embodiment of the present invention.

An acoustic wave device 1 is a duplexer and includes a reception filter 2 and a transmission filter 3. One end of the reception filter 2 and the transmission filter 3 are connected to an antenna terminal 4. The reception filter 2 and the transmission filter 3 are each an acoustic wave filter. In the reception filter 2, a one-port acoustic wave resonator 5 is connected to a longitudinally coupled acoustic wave resonator filter 6 in series. The transmission filter 3 includes a plurality of series arm resonators S1 to S3 and a plurality of parallel arm resonators P1 and P2. The series arm resonators S1 to S3 and the parallel arm resonators P1 and P2 are each a one-port acoustic wave resonator. That is, the transmission filter 3 in FIG. 5 is a partial cut-away plan view illustrating, for example, a ladder filter including a plurality of acoustic wave resonators.

In the acoustic wave resonator 5 and the longitudinally coupled acoustic wave resonator filter 6 of the reception filter 2, to define a piston mode, first and second edge regions are provided in the intersecting region of an IDT electrode. The length of the first and second edge regions is different between the acoustic wave resonator 5 and the longitudinally coupled acoustic wave resonator filter 6. With this configuration, a transverse mode can be more effectively reduced or prevented. The structures of the acoustic wave resonator 5 and the longitudinally coupled acoustic wave resonator filter 6 are described in detail.

Figure 2:
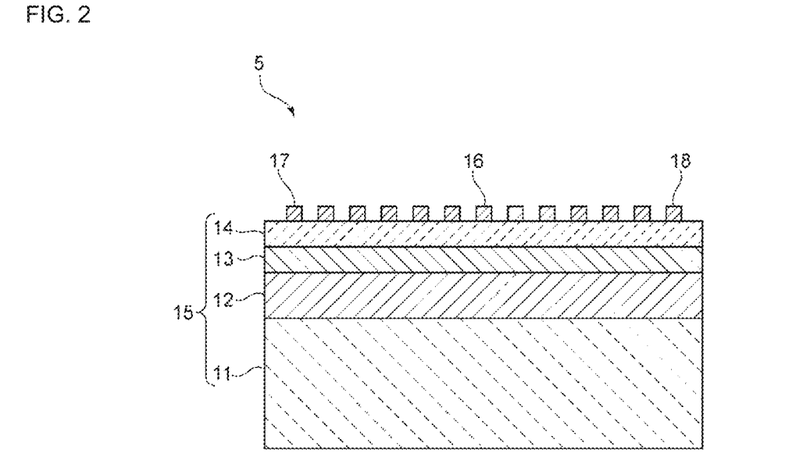
FIG. 2 is a front sectional view illustrating the structure of an acoustic wave resonator in the acoustic wave device according to the first preferred embodiment of the present invention.
Figure 3:
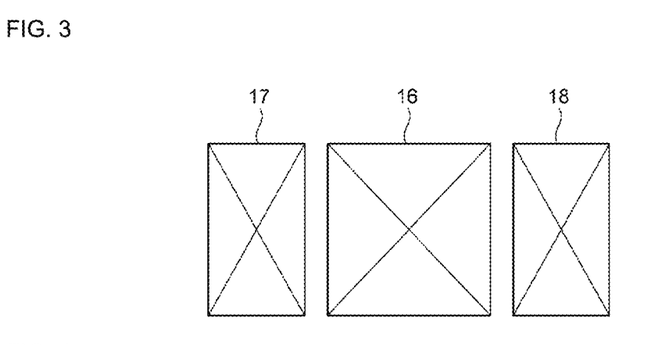
FIG. 3 is a schematic plan view illustrating the electrode arrangement of the acoustic wave resonator in the acoustic wave device according to the first preferred embodiment of the present invention.

FIG. 2 is a front sectional view illustrating the structure of the acoustic wave resonator 5. In the acoustic wave resonator 5, an IDT electrode 16 and reflectors 17 and 18 are provided on a first piezoelectric substrate 15. FIG. 3 is a schematic plan view illustrating the portion in which the IDT electrode 16 and the reflectors 17 and 18 are provided. The reflectors 17 and 18 are provided in the respective side portions in the acoustic wave propagation direction of the IDT electrode 16. With this, the one-port acoustic wave resonator is provided.

As illustrated in FIG. 2, in the first piezoelectric substrate 15, a support substrate 11, a high acoustic velocity film 12 that is a high acoustic velocity material layer, a low acoustic velocity film 13 that is a low acoustic velocity material layer, and a piezoelectric film 14 are stacked in this order. On the piezoelectric film 14, the IDT electrode 16 is stacked. In the first preferred embodiment, the piezoelectric film 14 is, for example, a lithium tantalate single crystal film.

The support substrate 11 is, for example, a semiconductor such as Si or SiC or an insulator such as aluminum oxide or quartz. The material of the support substrate 11 is not particularly limited.

The high acoustic velocity film 12 is made of a high acoustic velocity material. Further, the low acoustic velocity film 13 is made of a low acoustic velocity material.

The high acoustic velocity material is a material through which a bulk wave is propagated at an acoustic velocity higher than an acoustic velocity at which an acoustic wave is propagated through the piezoelectric film 14. As such a high acoustic velocity material, for example, there can be used various materials such as aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, diamond-like carbon (DLC) film, or diamond, a medium containing the above-described materials as its main components, or a medium including the mixture of the above-described materials as its main component.

The low acoustic velocity material is a material through which a bulk wave is propagated at an acoustic velocity lower than an acoustic velocity at which a bulk wave is propagated through the piezoelectric film 14. As such a low acoustic velocity material, for example, there can be used various materials such as silicon oxide, glass, silicon oxynitride, or tantalum oxide, a compound obtained by adding fluorine, carbon, boron, hydrogen, or a silanol group to silicon oxide, or a medium including the above-mentioned materials as its main components.

Note that the high acoustic velocity material layer may also define and function as the support substrate.

Figure 4:
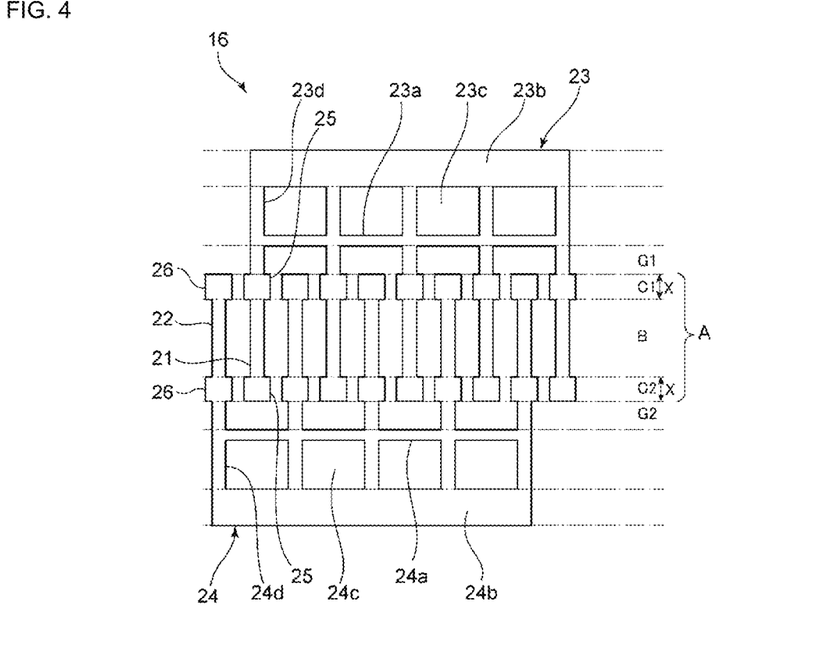
FIG. 4 is a plan view illustrating an IDT electrode of the acoustic wave resonator in the acoustic wave device according to the first preferred embodiment of the present invention.
Figure 5:
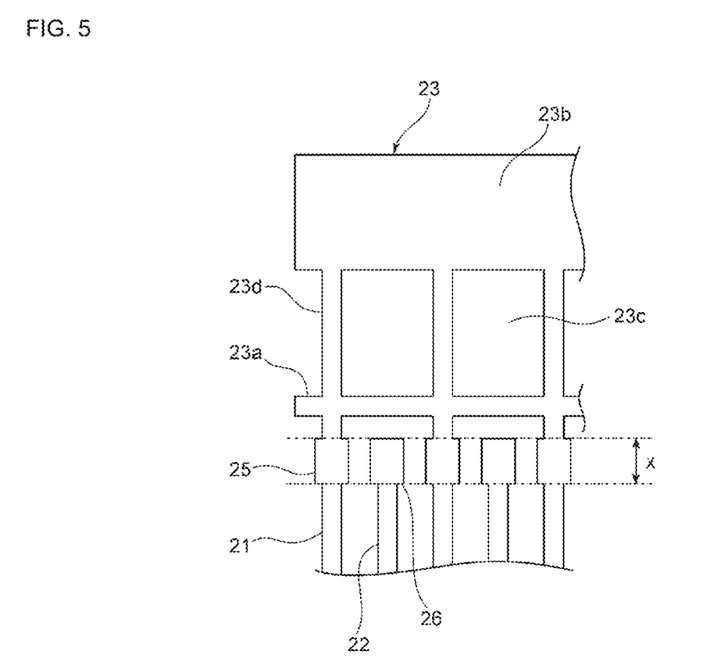
FIG. 5 is a partial cut-away plan view illustrating, in an enlarged manner, the principal portion of the IDT electrode illustrated in FIG. 4.

FIG. 4 is a plan view illustrating the IDT electrode 16 of the acoustic wave resonator 5, and FIG. 5 is a partial cut-away plan view illustrating the principal portion of FIG. 4 in an enlarged manner. The IDT electrode 16 includes a plurality of first electrode fingers 21 and a plurality of second electrode fingers 22. The plurality of first electrode fingers 21 and the plurality of second electrode fingers 22 are interdigitated with each other. The base end portion of the first electrode finger 21 is connected to a first busbar 23. In the first busbar 23, a plurality of cavities 23c are provided along the acoustic wave propagation direction. The portion on an intersecting region (described later) side of the cavity 23c is an inner busbar portion 23a. The region on the outer side in the overlap width direction of the cavity 23c is an outer busbar portion 23b. A connection portion 23d is located in the extension of the first electrode finger 21. The connection portion 23d connects the inner busbar portion 23a and the outer busbar portion 23b to each other.

The base end portion of the second electrode finger 22 is connected to a second busbar 24. The second busbar 24 is configured similarly to the first busbar 23. That is, the second busbar 24 includes an inner busbar portion 24a, an outer busbar portion 24b, a plurality of cavities 24c, and a plurality of connection portions 24d.

With respect to the first busbar 23 and the second busbar 24, the inner busbar portions 23a and 24a, the outer busbar portions 23b and 24b, and the cavities 23c and 24c are not necessarily provided.

The region in which the first electrode finger 21 and the second electrode finger 22 are overlapped with each other in the acoustic wave propagation direction is an intersecting region A. The intersecting region A includes a central region B and first and second edge regions C1 and C2 located in the outer side portions in the extending direction of the first and second electrode fingers 21 and 22 of the central region B. In the first and second edge regions C1 and C2, the first electrode finger 21 and the second electrode finger 22 respectively have a wide width portion 25 and a wide width portion 26. That is, the width of the first and second electrode fingers 21 and 22 in the first and second edge regions C1 and C2 is larger than the width of the first and second electrode fingers 21 and 22 in the central region B. The width of an electrode finger means a dimension in a direction orthogonal to the extending direction of the first and second electrode fingers 21 and 22.

Here, the dimension in the extending direction of the first and second electrode fingers 21 and 22 of the first and second edge regions C1 and C2 is regarded as a length X of the first and second edge regions C1 and C2. The wide width portions 25 and 26 are provided over the length X.

Meanwhile, the acoustic velocity in the first and second edge regions C1 and C2 is lower than the acoustic velocity in the central region B since the wide width portions 25 and 26 are provided. Further, first and second gap regions G1 and G2 are provided in the outer side portions in the extending direction of the first and second electrode fingers 21 and 22 of the first and second edge regions C1 and C2. The acoustic velocity in the first and second gap regions G1 and G2 and the regions in which the cavities 23c and 24c of the first and second busbars 23 and 24 are provided is higher than the acoustic velocity in the first and second edge regions C1 and C2. Thus, a piston mode is generated and transverse mode ripples can thus be reduced or prevented. Note that the cavities 23c and 24c of the first and second busbars 23 and 24 are not necessarily provided. A piston mode is generated as long as the acoustic velocity in the first and second gap regions G1 and G2 is higher than the acoustic velocity in the first and second edge regions C1 and C2.

Figure 6:
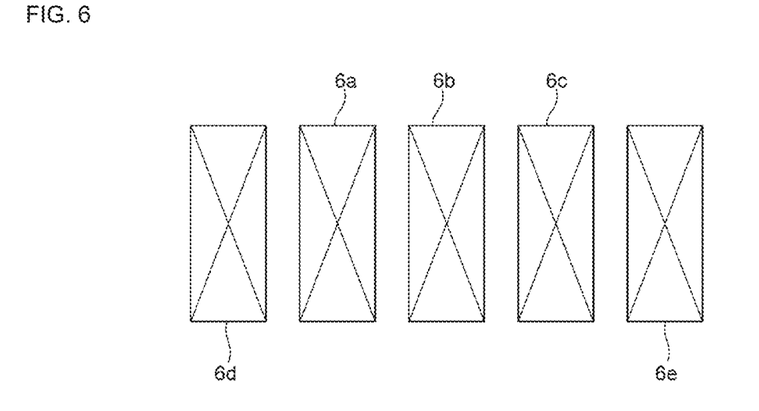
FIG. 6 is a schematic plan view illustrating the electrode arrangement of a longitudinally coupled acoustic wave resonator filter in the acoustic wave device according to the first preferred embodiment of the present invention.

With reference to FIG. 4 and FIG. 5, the structure of the IDT electrode 16 of the acoustic wave resonator 5 has been described, and IDT electrodes of the longitudinally coupled acoustic wave resonator filter 6 illustrated in FIG. 1 have a similar structure. FIG. 6 is a schematic plan view illustrating the portion in which the plurality of IDT electrodes of the longitudinally coupled acoustic wave resonator filter 6 are provided. On a first piezoelectric substrate, which also defines and functions as a second piezoelectric substrate, the electrode structures illustrated in FIG. 6 are provided. With this configuration, the longitudinally coupled acoustic wave resonator filter 6 is provided. The longitudinally coupled acoustic wave resonator filter 6 may be provided on, instead of the first piezoelectric substrate, the second piezoelectric substrate different from the first piezoelectric substrate. In the longitudinally coupled acoustic wave resonator filter 6, a plurality of IDT electrodes 6a to 6c are provided along the acoustic wave propagation direction. Reflectors 6d and 6e are provided on the outer side portions in the acoustic wave propagation direction of the region in which the IDT electrodes 6a to 6c are provided. The number of the plurality of IDT electrodes 6a to 6c is not particularly limited.

Also in the plurality of IDT electrodes 6a to 6c of the longitudinally coupled acoustic wave resonator filter 6, as in the IDT electrode 16 illustrated in FIG. 4 and FIG. 5, the intersecting region A includes the central region B and the first and second edge regions C1 and C2 to generate a piston mode.

Figure 7A:
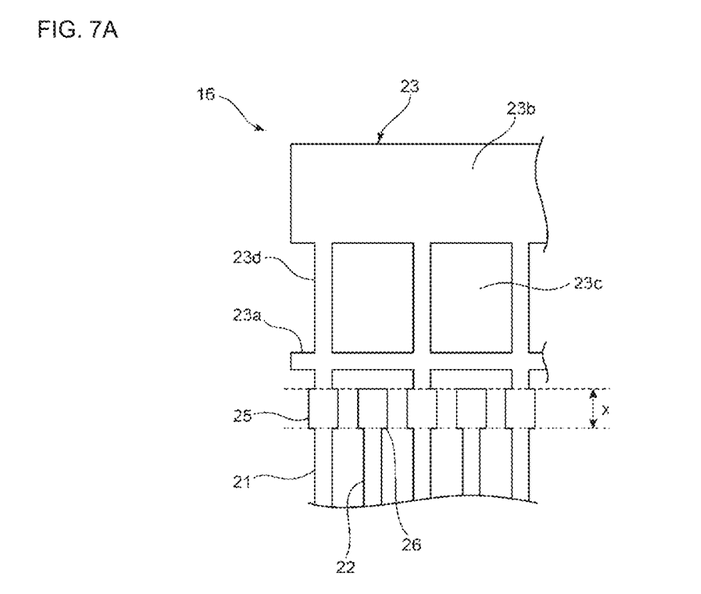
FIGS. 7A and 7B are partial cut-away plan views illustrating the principal portion of the IDT electrode of the acoustic wave resonator and the principal portion of an IDT electrode of the longitudinally coupled acoustic wave resonator filter of the acoustic wave device according to the first preferred embodiment of the present invention.
Figure 7B:
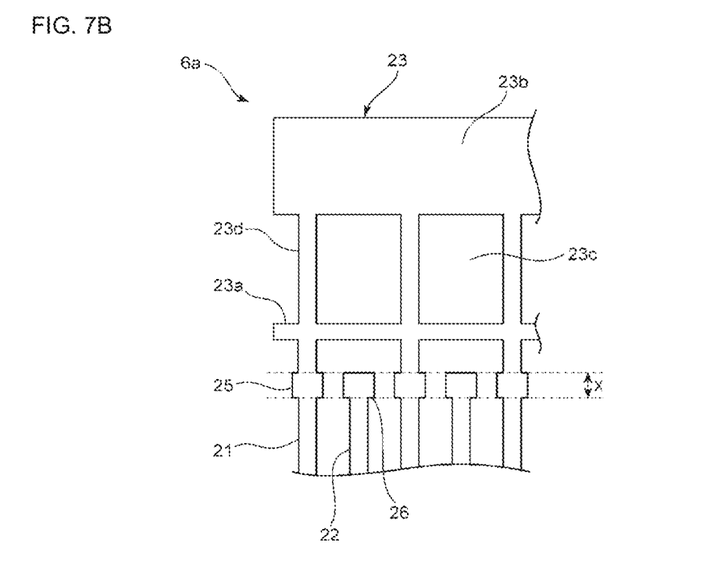

As illustrated in FIGS. 7A and 7B, the present preferred embodiment includes a feature in that the length X of the first and second edge regions C1 and C2 of the IDT electrodes 6a to 6c in the longitudinally coupled acoustic wave resonator filter 6 is shorter than the length X of the first and second edge regions C1 and C2 in the IDT electrode 16 of the acoustic wave resonator 5. With this, transverse mode ripples can be effectively reduced or prevented both in the acoustic wave resonator 5 and in the longitudinally coupled acoustic wave resonator filter 6.

The inventors of preferred embodiments of the present invention have discovered that in a combined acoustic wave device including an acoustic wave resonator and a longitudinally coupled acoustic wave resonator filter, when first and second edge regions are provided to reduce or prevent transverse mode ripples, a transverse mode cannot be sufficiently reduced or prevented in both of the acoustic wave resonator and the longitudinally coupled acoustic wave resonator filter in some cases. Further, the inventors of preferred embodiments of the present invention have also discovered that the transverse mode ripple reduction or prevention effect is different between the acoustic wave resonator and the longitudinally coupled acoustic wave resonator filter depending on the length of the first and second edge regions, and have developed preferred embodiments of the present invention. This is described with reference to FIGS. 8A and 8B to FIG. 12.

EXAMPLE 1

As the acoustic wave device according to the first preferred embodiment, an acoustic wave device of Example 1 of a preferred embodiment of the present invention described below was produced. The same or substantially the same piezoelectric substrate was used as the first piezoelectric substrate 15 of the acoustic wave resonator 5 and the piezoelectric substrate of the longitudinally coupled acoustic wave resonator filter 6. A Si substrate was used as the support substrate 11. A silicon nitride film was used as the high acoustic velocity film 12. The thickness of the high acoustic velocity film 12 was set to about 900 nm. A silicon oxide film was used as the low acoustic velocity film 13. The thickness of the low acoustic velocity film 13 was set to about 600 nm.

A 50° Y cut X propagation $LiTaO_3$ film was used as the piezoelectric film 14. The film thickness was set to about 600 nm.

An AlCu film was used as the electrode material of the IDT electrode 16 and the reflectors 17 and 18. The thickness was set to 100 nm. A Ti layer having a thickness of 12 nm was provided as an adhesion layer between the AlCu film and the piezoelectric film 14. A Ti layer having a thickness of 4 nm was provided as an adhesion layer on the AlCu film. A silicon oxide film was stacked as a protective film on the IDT electrode 16. The thickness of the silicon oxide film was set to about 35 nm.

The duty in the central region B of the IDT electrode 16 was set to about 0.45 and the duty in the first and second edge regions C1 and C2 thereof was set to about 0.7. A wavelength λ that is defined by the electrode finger pitch of the IDT electrode 16 was set to about 2 μm.

Meanwhile, also in the longitudinally coupled acoustic wave resonator filter 6, IDT electrodes and a protective film were configured in the same or similar manner.

Figure 8A:
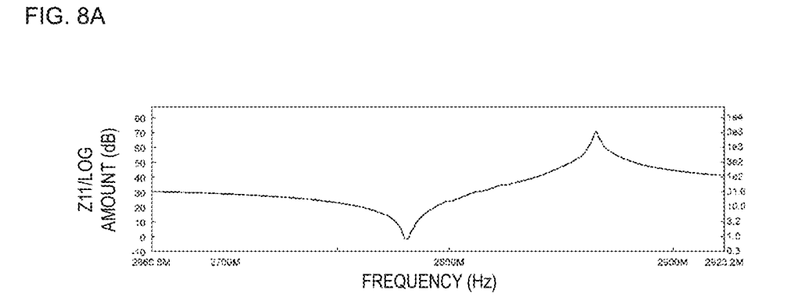
FIG. 8A is a diagram illustrating the impedance characteristics of the acoustic wave resonator in the acoustic wave device according to the first preferred embodiment.
Figure 8B:
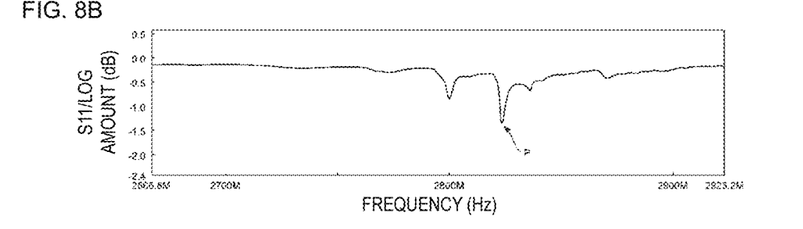
FIG. 8B is a diagram illustrating S11 characteristics of the acoustic wave resonator.

FIGS. 8A and 8B are diagrams illustrating the impedance characteristics and S11 characteristics of the acoustic wave resonator in Example 1 described above. In the S11 characteristics of FIG. 8B, a plurality of ripples indicated by an arrow P appear.

The strength of the largest ripple of the plurality of ripples was regarded as a ripple strength.

Further, in Example 1, the length of the first and second edge regions C1 and C2 was changed within the range of from about 0.2λ or more and about 1.2λ or less.

Figure 9:
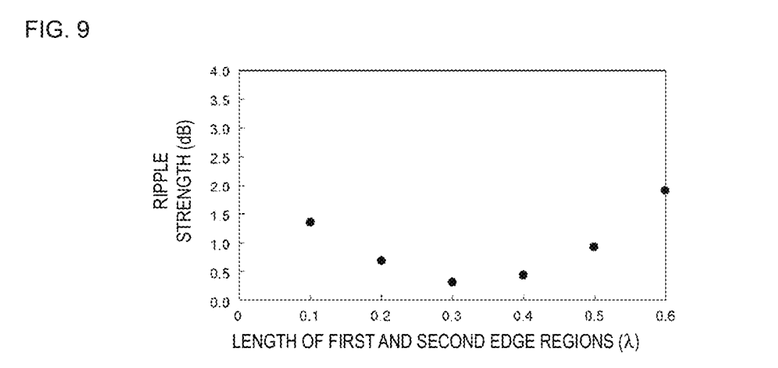
FIG. 9 is a diagram illustrating a relationship between the length of first and second edge regions of an acoustic wave resonator in an acoustic wave device according to Example 1 of a preferred embodiment of the present invention and a ripple strength that is the strength of a transverse mode ripple.
Figure 10:
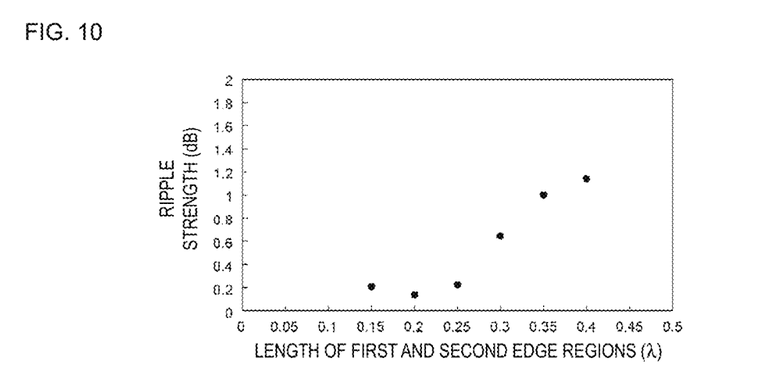
FIG. 10 is a diagram illustrating a relationship between the length of first and second edge regions of a longitudinally coupled acoustic wave resonator filter in Example 1 and a ripple strength that is the strength of a transverse mode ripple.

FIG. 9 is a diagram illustrating a relationship between the length of the first and second edge regions C1 and C2 in the acoustic wave resonator 5 and the ripple strength. FIG. 10 is a diagram illustrating a relationship between the length of the first and second edge regions C1 and C2 in the longitudinally coupled acoustic wave resonator filter 6 and the ripple strength.

As is apparent from FIG. 9, in the acoustic wave resonator 5, it was discovered that the length of the first and second edge regions C1 and C2 is most preferably about 0.3λ that achieves the smallest ripple strength. Further, it was discovered that when the length of the first and second edge regions C1 and C2 is about 0.2λ or more and about 0.5λ or less, the ripple strength can be about 1.0 dB or less, which is small. Meanwhile, in the longitudinally coupled acoustic wave resonator filter 6, it was discovered that when the length of the first and second edge regions C1 and C2 is about 0.2λ, the ripple strength is smallest. Further, it was discovered that when the length of the first and second edge regions C1 and C2 is about 0.15λ or more and about 0.25λ or less, the ripple strength can be about 0.4 dB or less, which is very small.

From FIG. 9 and FIG. 10, when the length X of the first and second edge regions C1 and C2 in the longitudinally coupled acoustic wave resonator filter 6 is shorter than the length X of the first and second edge regions C1 and C2 in the acoustic wave resonator 5, transverse mode ripples can be effectively reduced or prevented both in the longitudinally coupled acoustic wave resonator filter 6 and the acoustic wave resonator 5.

The reason why a transverse mode can be reduced or prevented in the longitudinally coupled acoustic wave resonator filter even when the length of the first and second edge regions is short as described above is considered as follows. When an ordinary acoustic wave resonator (one-port resonator) and the longitudinally coupled acoustic wave resonator filter are compared to each other, even with the same or substantially the same IDT electrode wavelength, the longitudinally coupled acoustic wave resonator filter can generate a resonant mode on a lower frequency side than the ordinary acoustic wave resonator since the longitudinally coupled acoustic wave resonator filter defines a mode by utilizing the reflectors. Thus, as compared to the ordinary acoustic wave resonator, the acoustic velocity in the central region of the longitudinally coupled acoustic wave resonator filter is low, and the acoustic velocity in the first and second edge regions thereof is therefore low. When the acoustic velocities in the central region and first and second edge regions of the IDT electrode drop in the same or similar manner, a relative acoustic velocity difference is large. Thus, in the longitudinally coupled acoustic wave resonator filter, a transverse mode can be reduced or prevented even when the length of the first and second edge regions is shorter than that of the ordinary acoustic wave resonator.

EXAMPLE 2

In Example 2 of a preferred embodiment of the present invention, 128.5° Y LiNbO$_3$ was used as the piezoelectric film. The thickness was set to about 125 nm. The IDT electrode is provided on the piezoelectric film. NiCr, Pt, Ti, AlCu, and Ti are stacked in order from the piezoelectric film side and the thicknesses of the respective films are about 10 nm, about 30 nm, about 30 nm, about 200 nm, and about 10 nm. Further, a first protective film made of SiO$_2$ covers the IDT electrode. The film thickness was set to about 600 nm. A SiN film is provided as a second protective film on the first protective film, which is the SiO$_2$ film. The film thickness was set to about 25 nm.

Figure 11:
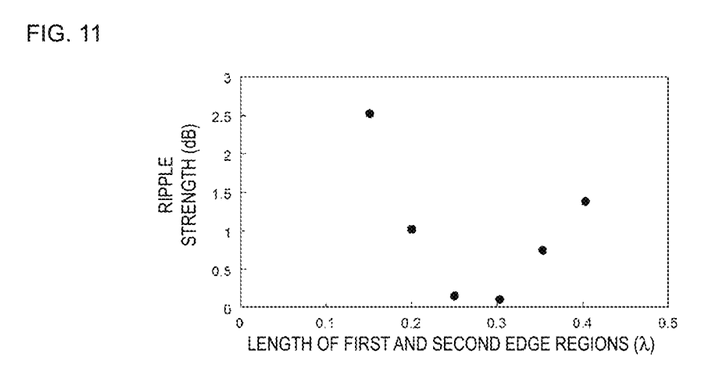
FIG. 11 is a diagram illustrating a relationship between the length of first and second edge regions of an acoustic wave resonator in an acoustic wave device of Example 2 in which a LiNbO$_3$ film is used and a ripple strength that is the strength of a transverse mode ripple.
Figure 12:
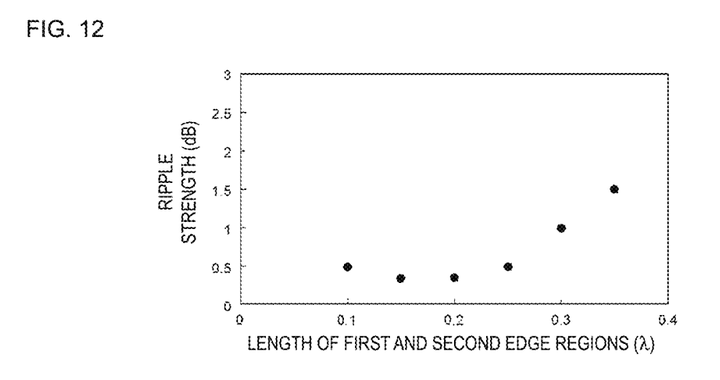
FIG. 12 is a diagram illustrating a relationship between the length of first and second edge regions of a longitudinally coupled acoustic wave resonator filter in Example 2 of a preferred embodiment of the present invention in which a LiNbO$_3$ film is used and a ripple strength that is the strength of a transverse mode ripple.

FIG. 11 is a diagram illustrating a relationship between the length of the first and second edge regions C1 and C2 of the acoustic wave resonator 5 in Example 2 and the ripple strength. FIG. 12 is a diagram illustrating a relationship between the length of the first and second edge regions C1 and C2 of the longitudinally coupled acoustic wave resonator filter 6 in Example 2 and the ripple strength.

As is apparent from FIG. 11, in the acoustic wave resonator 5, when the length of the first and second edge regions C1 and C2 is about 0.3λ, the ripple strength is smallest. Moreover, when the length of the first and second edge regions C1 and C2 is about 0.25λ or more and about 0.35λ or less, the ripple strength can be about 1.0 dB or less, which is small. Further, as is apparent from FIG. 12, in the longitudinally coupled acoustic wave resonator filter 6, when the length of the first and second edge regions C1 and C2 is about 0.15λ, the ripple strength is smallest. Moreover, it is found that when the length of the first and second edge regions C1 and C2 is about 0.1λ or more and about 0.25λ or less, the ripple strength can be approximately about 0.5 dB, which is very small.

As is apparent from FIG. 11 and FIG. 12, it was discovered that in the case where LiNbO$_3$ is used as the piezoelectric film 14, when the length of the first and second edge regions C1 and C2 in the longitudinally coupled acoustic wave resonator filter 6 is shorter than the length of the first and second edge regions C1 and C2 in the acoustic wave resonator 5, the ripple strength can be effectively reduced both in the longitudinally coupled acoustic wave resonator filter 6 and the acoustic wave resonator 5.

Figure 13:
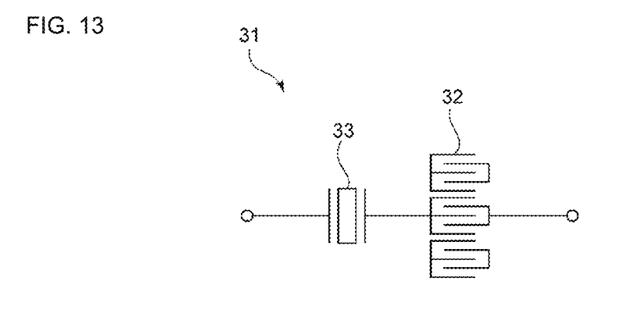
FIG. 13 is a circuit diagram of an acoustic wave device according to a second preferred embodiment of the present invention.

FIG. 13 is a circuit diagram of an acoustic wave device according to a second preferred embodiment of the present invention. In an acoustic wave device 31, an acoustic wave resonator 33 is connected to a longitudinally coupled acoustic wave resonator filter 32 in series. The acoustic wave device 31 is a single-bandpass filter. Preferred embodiments of the present invention are also applicable to such a single-bandpass filter. That is, the present invention is widely applicable to various acoustic wave devices including acoustic wave resonators and longitudinally coupled acoustic wave resonator filters.

Figure 14:
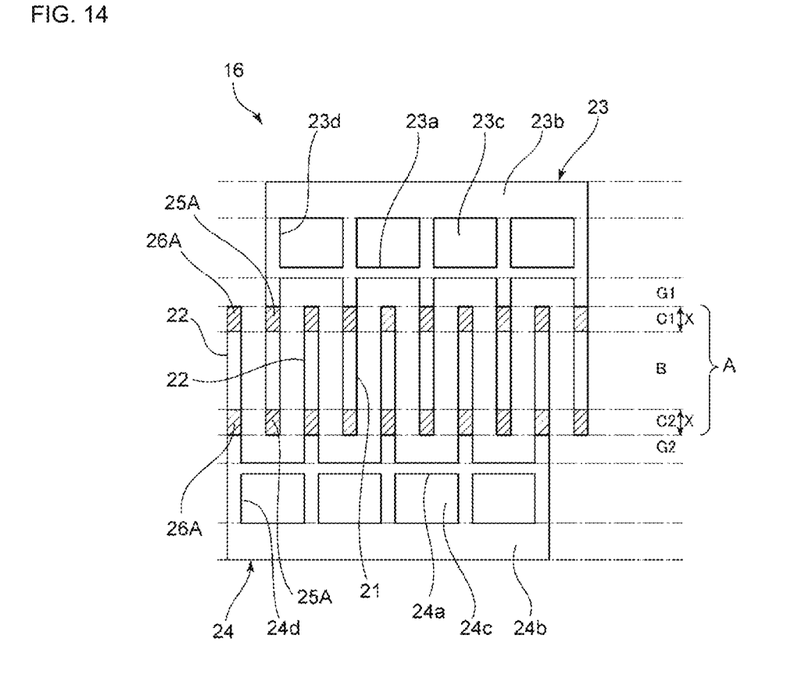
FIG. 14 is a plan view illustrating a modification of an IDT electrode in the acoustic wave device according to the second preferred embodiment of the present invention.

Further, the wide width portions are provided to reduce the acoustic velocity in the first and second edge regions C1 and C2 in the first preferred embodiment, but as illustrated in FIG. 14, mass addition films 25A and 26A may be stacked in the first and second edge regions C1 and C2. In FIG. 14, the hatched portions are portions in which the mass addition films 25A and 26A are stacked. With the mass addition films 25A and 26A stacked, the acoustic velocity in the first and second edge regions C1 and C2 can be reduced. As the material of such mass addition films 25A and 26A, an insulator such, for example, as silicon oxide or silicon oxynitride, metal such as Ni or W, or an alloy can be used. Further, the mass addition films 25A and 26A may be provided along the acoustic wave propagation direction to extend to the regions between the adjacent electrode fingers, thus forming a stripe. In such a case, as the material of the mass addition films 25A and 26A, an insulating material needs to be used. Note that when the mass addition films 25A and 26A are provided in the acoustic wave resonator 5 and the longitudinally coupled acoustic wave resonator filter 6 to define a piston mode, the thickness of the mass addition films 25A and 26A in the first and second edge regions C1 and C2 of the acoustic wave resonator 5 may be the same or substantially the same as the thickness of the mass addition films 25A and 26A in the first and second edge regions C1 and C2 of the longitudinally coupled acoustic wave resonator filter 6.

Further, in the first and second edge regions, the mass addition film may be stacked on the surfaces opposite to the piezoelectric substrate of the electrode fingers or stacked between the electrode fingers and the piezoelectric substrate. When the mass addition film is stacked between the electrode fingers and the piezoelectric substrate, the mass addition film may extend from the first and second edge regions to the portions between the busbar and the piezoelectric substrate through the first or second gap region.

Moreover, a dielectric film covering the IDT electrode and the piezoelectric substrate may be substituted for the mass addition film. In this case, the thickness of the dielectric film in the first and second edge regions is larger than the thickness of the dielectric film in the central region. Also with this configuration, the acoustic velocity in the first and second edge regions can be lower than that in the central region.

Figure 15:
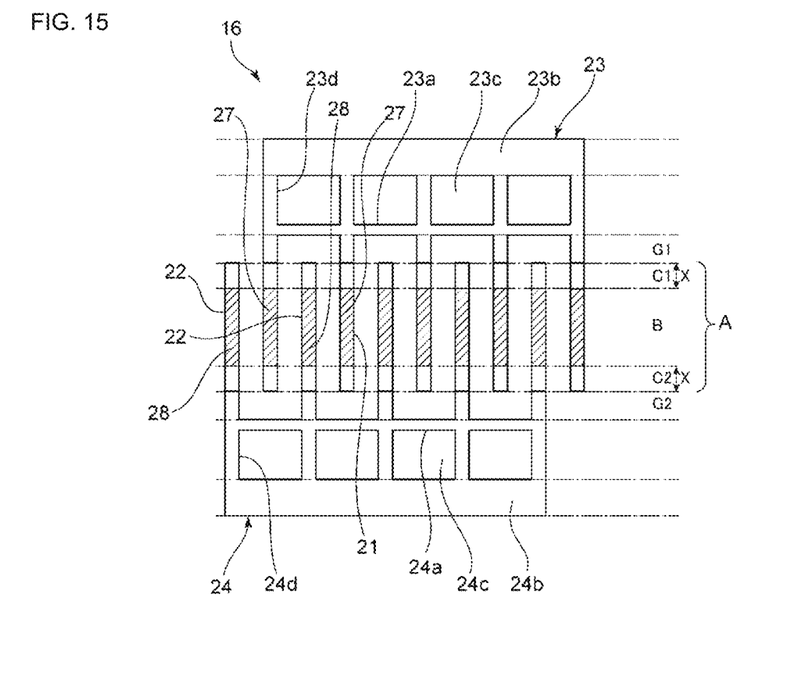
FIG. 15 is a plan view illustrating another modification of the IDT electrode in the acoustic wave device according to the second preferred embodiment of the present invention.

Moreover, as illustrated in FIG. 15, in the central region B of the first and second electrode fingers 21 and 22, as illustrated by hatching, acceleration films 27 and 28 to increase an acoustic velocity may be stacked. In this case, the acceleration films 27 and 28 are not provided in the first and second edge regions C1 and C2. With this, the acoustic velocity in the first and second edge regions C1 and C2 may be relatively reduced. The acceleration film indicates a film through which a bulk wave is propagated at an acoustic velocity faster than an acoustic velocity at which an acoustic wave is propagated through the piezoelectric film, and as the material of the acceleration films 27 and 28, for example, $Al_2O_3$, SiN, AlN, and the like can be used. The acceleration films 27 and 28 illustrated in FIG. 15 are stacked on the first and second electrode fingers 21 and 22, but the acceleration films 27 and 28 may also be embedded in the region between the first and second electrode fingers 21 and 22. That is, in the central region B, the acceleration films 27 and 28 may extend in the acoustic wave propagation direction. In this case, the acceleration films 27 and 28 may be integrated with each other. Note that when the acceleration films 27 and 28 are provided in the acoustic wave resonator 5 and the longitudinally coupled acoustic wave resonator filter 6 to define a piston mode, the thickness of the acceleration films 27 and 28 in the central region B of the acoustic wave resonator 5 may be the same or substantially the same as the thickness of the acceleration films 27 and 28 in the central region B of the longitudinally coupled acoustic wave resonator filter 6.

Further, the acceleration films 27 and 28 may be provided in the first and second edge regions C1 and C2. In this case, the film thickness of the acceleration films 27 and 28 in the first and second edge regions C1 and C2 is smaller than the film thickness of the acceleration films 27 and 28 in the central region B. Also with such a configuration, the acoustic velocity in the first and second edge regions C1 and C2 can be lower than that in the central region B.

As described above, in preferred embodiments of the present invention, the configuration for achieving the acoustic velocity in the first and second edge regions C1 and C2 lower than the acoustic velocity in the central region B is not particularly limited.

Further, in the piezoelectric substrate described above, the high acoustic velocity material layer may define and function as the support substrate. That is, a support substrate made of a high acoustic velocity material may be used.

Further, in the example described in the first or second preferred embodiment, in the acoustic wave resonator and the longitudinally coupled acoustic wave resonator filter connected to each other in series, the length of the edge regions in the longitudinally coupled acoustic wave resonator filter is shorter than the length of the edge regions in the acoustic wave resonator. However, the example of the application of the present invention is not limited to this example. For example, the present invention may be applied to at least one acoustic wave resonator of the series arm resonators S1 to S3 and the parallel arm resonators P1 and P2 included in the transmission filter 3 illustrated in FIG. 1 and the longitudinally coupled acoustic wave resonator filter 6 included in the reception filter 2. Specifically, the length of the first and second edge regions C1 and C2 in the longitudinally coupled acoustic wave resonator filter 6 may be shorter than the length of the first and second edge regions C1 and C2 in at least one acoustic wave resonator of the series arm resonators S1 to S3 and the parallel arm resonators P1 and P2. That is, the present invention is applicable to any acoustic wave device including one or more one-port acoustic wave resonators and one or more longitudinally coupled acoustic wave resonator filters, and the acoustic wave resonator and longitudinally coupled acoustic wave resonator filter whose edge region lengths are changed may be provided at any location in the acoustic wave device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
an acoustic wave resonator on a first piezoelectric substrate and including an IDT electrode; and
a longitudinally coupled acoustic wave resonator filter on a second piezoelectric substrate and including a plurality of IDT electrodes; wherein
the IDT electrode of the acoustic wave resonator and the IDT electrodes of the longitudinally coupled acoustic wave resonator filter each include a plurality of electrode fingers;
the plurality of electrode fingers include an intersecting region in which the electrode fingers are overlapped with each other in an acoustic wave propagation direction;
the intersecting region includes a central region and first and second edge regions on respective outer side portions in an extending direction of the electrode fingers of the central region and have a lower acoustic velocity than the central region;

first and second gap regions are provided, the first and second gap regions being on outer side portions in the extending direction of the electrode fingers of the first and second edge regions and having a higher acoustic velocity than the central region; and when a dimension along the extending direction of the electrode fingers of the first and second edge regions is a length of the first and second edge regions, the length of the first and second edge regions in the longitudinally coupled acoustic wave resonator filter is shorter than the length of the first and second edge regions in the acoustic wave resonator.

2. The acoustic wave device according to claim 1, wherein the first piezoelectric substrate and the second piezoelectric substrate are a same piezoelectric substrate.

3. The acoustic wave device according to claim 1, wherein the second piezoelectric substrate is a piezoelectric substrate different from the first piezoelectric substrate.

4. The acoustic wave device according to claim 1, wherein a width of the plurality of electrode fingers in the first and second edge regions is larger than a width of the plurality of electrode fingers in the central region.

5. The acoustic wave device according to claim 1, wherein a mass addition film is provided on the plurality of electrode fingers in the first and second edge regions.

6. The acoustic wave device according to claim 5, wherein a thickness of the mass addition film in the acoustic wave resonator is the same or substantially the same as a thickness of the mass addition film in the longitudinally coupled acoustic wave resonator filter.

7. The acoustic wave device according to claim 1, wherein an acceleration film is stacked on the electrode fingers in the central region.

8. The acoustic wave device according to claim 1, wherein the first piezoelectric substrate and the second piezoelectric substrate each include a multilayer body in which a high acoustic velocity material layer and a piezoelectric film are stacked in this order; and an acoustic velocity at which a bulk wave is propagated through the high acoustic velocity material layer is higher than an acoustic velocity at which an acoustic wave is propagated through the piezoelectric film.

9. The acoustic wave device according to claim 8, wherein the first piezoelectric substrate and the second piezoelectric substrate each include a low acoustic velocity film between the high acoustic velocity material layer and the piezoelectric film; and an acoustic velocity at which a bulk wave is propagated through the low acoustic velocity film is lower than an acoustic velocity at which a bulk wave is propagated through the piezoelectric film.

10. The acoustic wave device according to claim 8, wherein the high acoustic velocity material layer is a support substrate made of a high acoustic velocity material.

11. The acoustic wave device according to claim 8, wherein the high acoustic velocity material layer is a high acoustic velocity film made of a high acoustic velocity material; and the acoustic wave device further includes a support substrate supporting the high acoustic velocity material layer.

12. The acoustic wave device according to claim 2, wherein a width of the plurality of electrode fingers in the first and second edge regions is larger than a width of the plurality of electrode fingers in the central region.

13. The acoustic wave device according to claim 3, wherein a width of the plurality of electrode fingers in the first and second edge regions is larger than a width of the plurality of electrode fingers in the central region.

14. The acoustic wave device according to claim 2, wherein a mass addition film is provided on the plurality of electrode fingers in the first and second edge regions.

15. The acoustic wave device according to claim 14, wherein a thickness of the mass addition film in the acoustic wave resonator is the same or substantially the same as a thickness of the mass addition film in the longitudinally coupled acoustic wave resonator filter.

16. The acoustic wave device according to claim 3, wherein a mass addition film is provided on the plurality of electrode fingers in the first and second edge regions.

17. The acoustic wave device according to claim 16, wherein a thickness of the mass addition film in the acoustic wave resonator is the same or substantially the same as a thickness of the mass addition film in the longitudinally coupled acoustic wave resonator filter.

18. The acoustic wave device according to claim 2, wherein an acceleration film is stacked on the electrode fingers in the central region.

19. The acoustic wave device according to claim 3, wherein an acceleration film is stacked on the electrode fingers in the central region.

* * * * *